(12) United States Patent
Eckel et al.

(10) Patent No.: US 10,930,770 B2
(45) Date of Patent: Feb. 23, 2021

(54) RC-IGBT

(71) Applicant: Infineon Technologies AG, Neubiberg (DE)

(72) Inventors: Hans-Guenter Eckel, Rostock (DE); Quang Tien Tran, Rostock (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/998,630

(22) Filed: Aug. 16, 2018

(65) Prior Publication Data

US 2019/0058057 A1 Feb. 21, 2019

(30) Foreign Application Priority Data

Aug. 16, 2017 (DE) ...................... 10 2017 118 665.4

(51) Int. Cl.
*H01L 29/739* (2006.01)
*H01L 29/78* (2006.01)
(Continued)

(52) U.S. Cl.
CPC ...... *H01L 29/7397* (2013.01); *H01L 29/0615* (2013.01); *H01L 29/0696* (2013.01); *H01L 29/1095* (2013.01); *H01L 29/78* (2013.01); *H01L 29/785* (2013.01); *H01L 29/8613* (2013.01); *H01L 29/872* (2013.01); *H01L 29/0847* (2013.01); *H01L 29/4238* (2013.01)

(58) Field of Classification Search
CPC .............. H01L 29/7397; H01L 29/872; H01L 29/1095; H01L 29/0696; H01L 29/0615; H01L 29/4238; H01L 29/0847; H01L 29/78; H01L 29/785; H01L 29/8613; H01L 27/0823; H01L 21/8222
See application file for complete search history.

(56) References Cited

U.S. PATENT DOCUMENTS

2014/0048847 A1\* 2/2014 Yamashita ............ H01L 29/407
257/140
2016/0141402 A1 5/2016 Hosokawa
(Continued)

FOREIGN PATENT DOCUMENTS

DE 102015121514 A1 6/2016
DE 102016116564 A1 3/2017

*Primary Examiner* — Cuong B Nguyen
(74) *Attorney, Agent, or Firm* — Murphy, Bilak & Homiller, PLLC (57) ABSTRACT

A power semiconductor device includes a semiconductor body, a first load terminal structure arranged at a front side of the semiconductor body, and a second load terminal structure arranged at a back side of the semiconductor body, and configured for controlling a load current between the load terminal structures by means of at least one transistor cell. The at least one transistor cell is at least partially included in the semiconductor body and electrically connected to the first load terminal structure on one side and to a drift region on the other side, the drift region being of a first conductivity type. The semiconductor body further includes: a transistor short region of the first conductivity type, wherein a transition between the transistor short region and the first load terminal structure forms a Schottky contact; and a separation region of a second conductivity type separating the transistor short and drift regions.

18 Claims, 5 Drawing Sheets

(51) Int. Cl.
*H01L 29/861* (2006.01)
*H01L 29/06* (2006.01)
*H01L 29/10* (2006.01)
*H01L 29/872* (2006.01)
*H01L 29/08* (2006.01)
*H01L 29/423* (2006.01)

(56) References Cited

U.S. PATENT DOCUMENTS

2017/0040316 A1   2/2017  Soeno
2017/0162681 A1   6/2017  Okawara et al.

* cited by examiner

RC-IGBT

TECHNICAL FIELD

This specification refers to embodiments of a power semiconductor device and of a method of processing a power semiconductor device. In particular, the specification is directed to embodiments of a power semiconductor device having reverse current capability, such as a reverse conducting IGBT.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current between two load terminals of the device. Further, the load current be controlled by means of a transistor cell that is at least partially included in the semiconductor body. For example, the transistor cell comprises an insulated electrode which may set the power semiconductor device in one of a forward conducting state and a blocking state upon receiving a corresponding control signal from, e.g., a driver unit.

Occasionally, such a power semiconductor device is further configured for conducting a reverse current between the two load terminals. For example, the reverse current may be conducted via a body diode of the device. In some cases, dedicated diode regions may be provided in order to enable such a reverse conducting state of the device. It is generally desirable to reduce the conduction losses both in the forward conducting state and in a reverse conducting state of such a device.

SUMMARY

According to an embodiment, a power semiconductor device comprises a semiconductor body, a first load terminal structure arranged at a front side of the semiconductor body, and a second load terminal structure arranged at a back side of the semiconductor body. The power semiconductor device is configured for controlling a load current between the first load terminal structure and the second load terminal structure by means of at least one transistor cell, the transistor cell being at least partially included in the semiconductor body and being electrically connected to the first load terminal structure on one side and to a drift region of the semiconductor body on the other side, the drift region being of a first conductivity type. The semiconductor body further comprises: a transistor short region being of the first conductivity type, wherein a transition between the transistor short region and the first load terminal structure forms a Schottky contact; and a separation region separating the transistor short region from the drift region and being of a second conductivity type complementary to the first conductivity type.

According to a further embodiment, a reverse conducting IGBT has a semiconductor body and a plurality of transistor cells implemented at least partially therein. The reverse conducting IGBT further comprises, within the semiconductor body and external of the transistor cells: a transistor short region being of a first conductivity type and interfacing with an emitter terminal of the reverse conducting IGBT, wherein a transition between the transistor short region and the emitter terminal forms a Schottky contact; and a separation region separating the transistor short region from a drift region of the reverse conducting IGBT, the separation region being of a second conductivity type complementary to the first conductivity type, and the drift region being of the first conductivity type.

According to yet a further embodiment, a method of processing a power semiconductor device comprises: providing a semiconductor body having a front side and a back side; providing, within the semiconductor body, a drift region being of a first conductivity type; creating at least one transistor cell at the front side, wherein the transistor cell is at least partially included in the semiconductor body and is electrically connected to the drift region; creating within the semiconductor body: a transistor short region being arranged at the front side and being of the first conductivity type, and a separation region separating the transistor short region from the drift region and being of a second conductivity type complementary to the first conductivity type; and creating a first load terminal structure at the front side, such that the first load terminal structure is electrically connected to the at least one transistor cell and a Schottky contact is formed at a transition between the transistor short region and the first load terminal structure.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

In the following detailed description, reference is made to the accompanying drawings which form a part hereof and in which are shown by way of illustration of specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting.

It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, in this specification, the expression "being of the first (second) conductivity type" that may be used to characterize specific semiconductor regions is intended to describe that the respective semiconductor region has a net dopant concentration of the first (second) conductivity type. This does generally not exclude the presence of dopants of the complementary second (first) conductivity at a lower dopant concentration as compared to the first (second) conductivity type.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell configuration, such as a power semiconductor transistor, that may be used within a power converter or a power supply. Thus, in an embodiment, the semiconductor device is configured to carry a load current that is to be fed to a load and/or, respectively, that is provided by a power source. For example, the semiconductor device may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 100 V, more typically 600 V and above, e.g., up to at least 6500 V. For example, the processed semiconductor device described below may be a semiconductor device exhibiting a stripe cell configuration or a square or polygonal cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor-based data processing FIGS. 1 to 5 each schematically and exemplarily illustrate a section of a vertical cross-section of a power semiconductor device 1 in accordance with some embodiments. The following description generally refers to all of FIGS. 1 to 5. Certain features of exemplary embodiments will be explained in more detail with explicit reference to one or more of FIGS. 1 to 5.

The illustrated cross-sections are in parallel to a plane defined by the first lateral direction X and the vertical direction Z. Each of the illustrated components of the power semiconductor device 1 may extend along the second lateral direction Y (not illustrated).

The power semiconductor device 1 comprises a semiconductor body 10, e.g., based on silicon or silicon carbide. Other possible semiconductor materials are mentioned further below. The semiconductor body 10 is coupled to each of a first load terminal structure 11 and a second load terminal structure 12 of the power semiconductor device 1. For example, the power semiconductor device 1 is an IGBT, such as a reverse conducting IGBT (RC-IGBT), and the first load terminal structure 11 is or comprises an emitter terminal of the IGBT. The second load terminal structure 12 may constitute or comprise, e.g., a collector terminal of the IGBT. For example, the first load terminal structure 11 comprises at least one first metallization 110, 111, 112, and the second load terminal structure 12 may comprise at least one second metallization.

The power semiconductor device 1 may exhibit a vertical set-up, according to which the semiconductor body 10 is sandwiched between the first load terminal structure 11 and the second load terminal structure 12. The first load terminal structure 11 may be arranged at a front side 10-1 of the semiconductor body 10, and the second load terminal structure 12 may be arranged at a back side 10-2 of the semiconductor body 10.

Accordingly, said at least one first metallization 110, 111, 112 of the first load terminal structure 11 can be a front side metallization, and said at least one second metallization of the second load terminal structure 12 can be a back side metallization. For example, by means of these terminal structures 11 and 12, the power semiconductor device 1 receives and outputs a load current. Accordingly, at least one of these terminal structures 11 and 12, e.g., the first load terminal structures 11, can include one or more bonding pads (not illustrated) so as to interface, e.g., with a number of bond wires.

The semiconductor body 10 includes a drift region 100 with dopants of the first conductivity type. For example, the drift region 100 is an $n^-$-doped region. Further, a dopant concentration and a total extension of the drift region 100 along the vertical direction Z may essentially determine a blocking capability, i.e., a maximum blocking voltage of the power semiconductor device 1. For example, the blocking voltage is greater than 500 V, greater than 1 kV, or even greater than 3 kV.

Further, one or more transistor cells 130 are arranged at the front side 10-1. The at least one transistor cell 130 may be at least partially included in the semiconductor body 10 and may be electrically connected to the first load terminal structure 11 on one side and to the drift region 100 on the other side. The power semiconductor device 1 may be configured for controlling a current flow between the first load terminal structure 11 and the second load terminal structure 12 by means of the at least one transistor cell 130. For example, the first cell 130 may comprise a MOS control head for controlling the current flow.

As exemplarily depicted in FIGS. 2 to 5, each transistor cell 130 may comprise at least one source region 104 that is electrically connected with the first load terminal structure 11. The source region 104 may be included in the semiconductor body 10 and may have a net dopant concentration of the first conductivity type, e.g. n-type. For example, the source region 104 comprises dopants of the first conductivity type (such as n-type) at a higher dopant concentration than the drift region 100. In other embodiments, the source region 104 may be formed, e.g., by means of a metal that is in contact with the semiconductor body 10, such as by a metal-to-semiconductor transition formed at a transition from a portion of the first load terminal structure 11 and the semiconductor body 10. The semiconductor body 10 may be configured for receiving and/or outputting a load current from and/or to the first load terminal structure 11 via the source region 104.

Further, each transistor cell 130 may comprise a channel region 101 (also referred to as body region 101) included in the semiconductor body 10. The channel region 101 may have a net dopant concentration of a second conductivity type complementary to the first conductivity type. For example, the channel region 101 has p-type dopants if the drift region 100 and the source region 104 each have n-type dopants. The channel region 101 may be arranged so as to isolate the source region 104 from the drift region 100. The transistor cell 130 may be configured for inducing a transport channel for dopants of the first conductivity type within the channel region 101.

In an embodiment, the channel region 101 is electrically connected with the first load terminal structure 11 (see FIGS. 2 to 5). For example, the channel region 101 may comprise a first port region 1010 being of the second conductivity type at a higher dopant concentration than the remaining portions of the channel region 101, wherein the first port region is in contact with a first portion 110 of the first load terminal structure 11. For example, an ohmic contact is established between the first port region 1010 and the first portion 110 of the first load terminal structure 11.

For example, a pn-junction is formed at a transition between the channel region 101 and the drift region 100. The pn-junction may be configured for blocking a blocking voltage in a blocking state of the power semiconductor device 1.

For controlling a load current flow through the power semiconductor device 1 between the first load terminal structure 11 and the second load terminal structure 12, each transistor cell 130 may further comprise a control electrode 1310 (also referred to as gate electrode) that is electrically connected with a control terminal (also referred to as gate terminal; not illustrated) of the power semiconductor device 1. The control electrode 1310 may be arranged and configured for inducing said transport channel within the channel region 101, such that the transport channel extends inside channel region 101 from the source region 104 to the drift region 100. For example, the control electrode 1310 is configured for inducing the transport channel in dependence on a control signal, such as a voltage signal, provided to the control electrode 1310 from external of the power semiconductor device 1. For example, the control signal may be provided via a gate terminal (not illustrated) of the power semiconductor device 1.

In an embodiment, the at least one control electrode 1310 extends at least partially within a trench 131 that is formed in the semiconductor body 10. For instance, the trench 131 comprises an insulation structure 1311 that insulates the control electrode 1310 from the channel region 101. The insulation structure 1311 may comprise a gate dielectric, such as an oxide, e.g., a silicon dioxide. For example, such a trench 131 extends from the front side 10-1 into the semiconductor body 10 essentially along the vertical direction Z, as depicted in FIGS. 2 to 5.

Opposite to the at least one transistor cell 130 being arranged at the front side 10-1, at least one first back side emitter region 105 is provided in the semiconductor body 10 at the back side 10-2. The first back side emitter region 105 is electrically connected with the second load terminal structure 12 (e.g. a back side metallization 12) and comprises dopants of the second conductivity type. For example, the first back side emitter region 105 may be realized as a $p^+$-doped semiconductor region if the drift region 100 is n-doped, such as in the case of an n-channel IGBT 1. The first back side emitter region 105 may be configured for injecting charge carriers of the second conductivity type into the drift region 100 in a forward-conducting state of the power semiconductor device 1. Thus, a bipolar forward-conducting mode may be realized, as is well known from IGBTs.

In an embodiment, a lateral extension of the first back side emitter region 105 amounts to at least 20%, such as at least 50%, or even 100% of a vertical extension of the semiconductor body 10 (i.e., a total chip thickness measured along the vertical direction Z).

The first back side emitter region 105 and the at least one transistor cell 130 exhibit a first common lateral extension range LX1 along the first lateral direction X. In other words, there is a finite lateral overlap LX1 along the first lateral direction X between the transistor cell 130 arranged at the front side 10-1 of the semiconductor body 10 and the first back side emitter region 105 arranged at the back side 10-2. For example, the first common lateral extension range LX1 amounts to at least 10%, at least 30%, at least 50%, or even to 100% of a lateral extension of the transistor cell 130 along the first lateral direction X. For example, in case there are a plurality of transistor cells 130 (cf. FIGS. 2-5) and/or a plurality of first back side emitter regions 105 provided in the semiconductor device 1, the sum of the respective first common lateral extension ranges LX1 of each transistor cell 130 with a first back side emitter region 105 may amount to at least 10%, at least 30%, or even at least 50% of the sum of the total lateral extensions of all transistor cells 130 along the first lateral direction X.

Further, in addition to the at least one first back side emitter region 105, at least one second back side emitter region 106 may be provided in the semiconductor body 10. The second back side emitter region 106 is electrically connected with the second load terminal structure 12 and has a net dopant concentration of the first conductivity type. For example, the second back side emitter region 106 may allow for a reverse current capability of the power semiconductor device 1. In an embodiment, the power semiconductor device 1 is a reverse conducting IGBT (RC-IGBT), wherein the at least one second back side emitter region 106 is a short region, such as an n-short region, arranged at the back side 10-2 so as to allow for a reverse conducting diode operation of the RC-IGBT 1.

For example, the back side 10-2 of the semiconductor body 10 exhibits one or more first back side emitter regions 105 functioning as "IGBT regions" and one or more second back side emitter regions 106 functioning as "diode regions" so as to allow for both IGBT operation in a forward-conducting state and diode operation in a reverse-conducting state of the power semiconductor device 1.

As illustrated in each of FIGS. 1 to 5, the semiconductor body 10 further comprises a transistor short region 107 being of the first conductivity type, wherein a transition between the transistor short region 107 and the first load terminal structure 11 forms a Schottky contact 108. For example, the transistor short region 107 is in contact with a second portion 112 of the first load terminal structure 11, which may comprise a metal, such as at least one of aluminum (Al), silver (Ag), gold (Au), palladium (Pd), platinum (Pt), nickel (Ni), molybdenum (Mo), titanium (Ti), tungsten (W) or silicides, such as e.g. platinum silicide (PtSi), cobalt silicide (CoSi), nickel silicide (NiSi), titanium silicide (TiSi), molybdenum silicide (MoSi), or manganese silicide (MnSi). In the vicinity of second portion 112 of the first load terminal structure 11, the transistor short region 107 may comprise, e.g., n-type dopants at a dopant concentration in a range from $10^{13}$ cm$^{-3}$ to $10^{17}$ cm$^{-3}$. The Schottky contact 108 may thus be formed as a metal-to-semiconductor transition between said second portion 112 and the transistor short region 107.

The Schottky contact 108 may be configured for reducing an emitter efficiency of the channel region 101 during the reverse conducting operation of the power semiconductor device 1 by providing for a possibility for charge carriers of the first conductivity type to flow to the first load terminal structure 11 without causing an injection of charge carriers of the second conductivity type from the channel region 101 into the drift region 100.

In an embodiment in accordance with FIGS. 2 to 5, the power semiconductor device 1 comprises at least two transistor cells 130, wherein the transistor short region 107 is arranged external of and laterally in between the at least two transistor cells 130.

For example, the transistor short region 107 is arranged laterally adjacent to and in contact with a trench 131 of the at least one transistor cell 130. The transistor short region 107 may also be arranged laterally adjacent to and in contact with one trench 131 each of two neighboring transistor cells 130 (cf. FIGS. 2 to 5).

In an embodiment, the transistor short region 107 may be laterally confined by at least two trenches 131, wherein a lateral distance of the trenches 131 is smaller than a depth of at least one of the trenches 131.

The semiconductor body 10 further comprises a separation region 109 separating the transistor short region 107 from the drift region 100 and being of a second conductivity type complementary to the first conductivity type. For example, the separation region 109 comprises dopants of the second conductivity type at a dopant concentration in a range from $10^{15}$ cm$^{-3}$ to $10^{18}$ cm$^{-3}$.

A transition between the separation region 109 and the drift region 100 may form a pn-junction 103-1. For example, a relatively high blocking capability of the power semiconductor device 1 may be ensured due to this pn-junction 103-1.

In an embodiment, at least a portion of the separation region 109 is arranged laterally adjacent to and in contact with a trench 131, such as a gate trench 131 of the power semiconductor device 1. For example, the separation region 109 extends within the semiconductor body 10 (along the vertical direction Z) at least as deep as ½ of a depth of said trench 131, such as at least as deep as the depth of the trench 131, or even at least as deep as 4/3 times the depth of the trench 131.

The separation region 109 may also be arranged laterally adjacent to and in contact with one trench 131 each of two neighboring transistor cells 130, as illustrated in FIGS. 2 to 5.

Within the transistor short region 107, the concentration of dopants of the first conductivity type may decrease at least by a factor of 10, such as at least by a factor of 100, or even at least by a factor of 1000 along a direction heading from the separation region 109 to the first load terminal structure 11 (such as along a direction opposite to the vertical direction Z).

For example, the transistor short region 107 comprises a first portion 107-1 interfacing with the first load terminal structure 11 and a second portion 107-2 interfacing with the separation region 109. The concentration of dopants of the first conductivity type within the first portion 107-1 may be lower than the concentration of dopants of the first conductivity type within second portion 107-2 at least by a factor of 10, such as at least by a factor of 100, or even at least by a factor of 1000.

Figure 3:
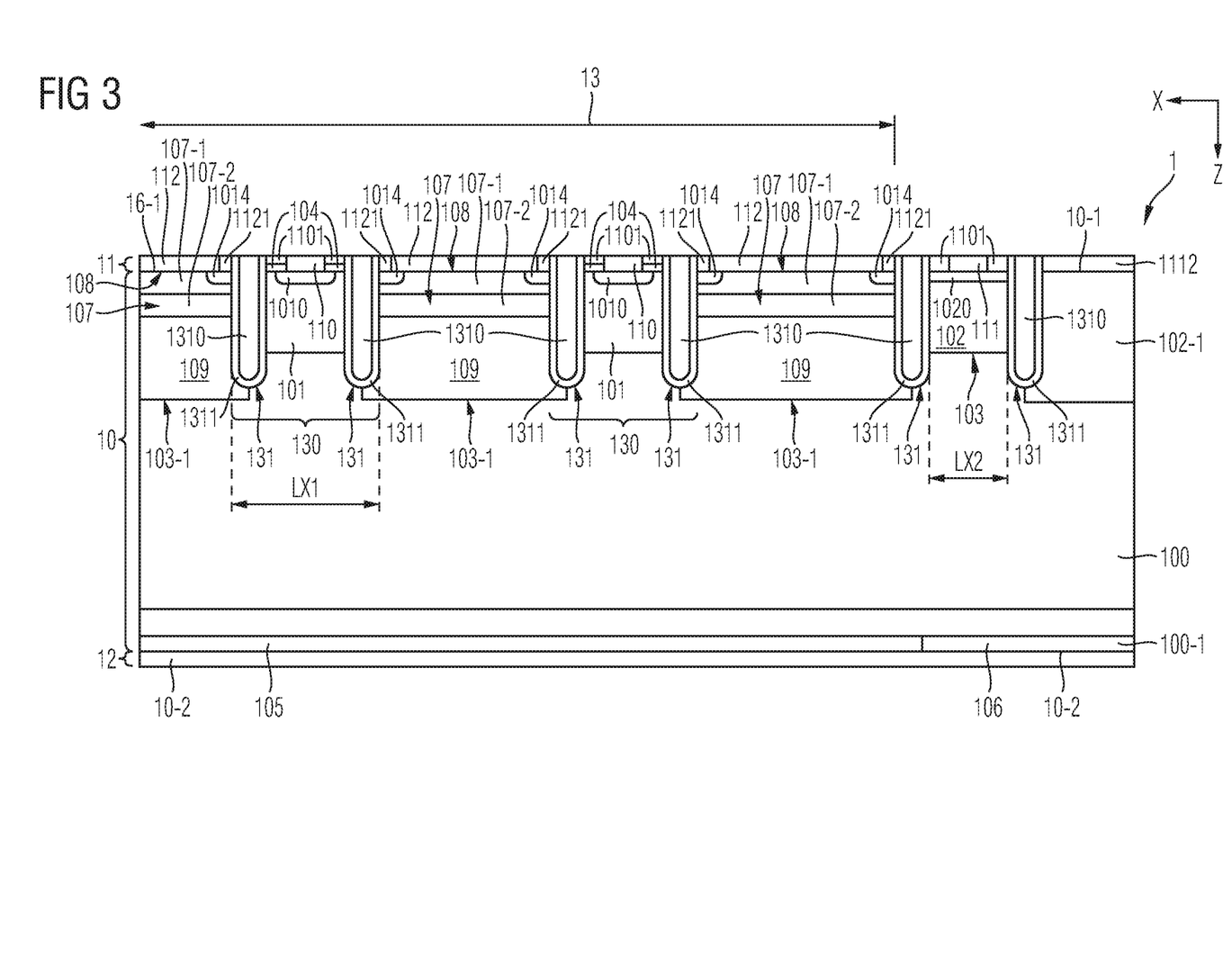
FIG. 3 schematically and exemplarily illustrates a section of a vertical cross-section of a power semiconductor device in accordance with one or more embodiments.

As illustrated in FIG. 3, the semiconductor body 10 may further comprise a contact region 1014 being of the second conductivity type and being arranged in contact with each of the first load terminal structure 11 and the transistor short region 107. The contact region 1014 may exhibit a concentration of dopants of the second conductivity type in a range from $10^{17}$ cm$^{-3}$ to $10^{20}$ cm$^{-3}$ For example, the contact region 1014 may be a p$^+$-doped semiconductor region.

In an embodiment, the contact region 1014 is arranged in contact with a trench 131. Further, the contact region 1014 may be separated from the separation region 109 by the transistor short region 107 (cf. FIG. 3).

A transition between the contact region 1014 and the transistor short region 107 may form a pn-junction. This pn-junction may provide an additional path (besides the Schottky contact 108) for charge carriers of the second conductivity type to flow out of the semiconductor body 10 into the first load terminal structure 11, e.g. upon switching of the power semiconductor device 1.

Referring to FIGS. 2 to 5, the power semiconductor device 1 may further comprise a diode emitter region 102 being arranged within the semiconductor body 10 external of the at least one transistor cell 130 and being of the second conductivity type. For example, the diode emitter region 102 takes the form of a p-well arranged at the front side 10-1. The diode emitter region 102 is electrically connected to the first load terminal structure 11. A transition between the diode emitter region 102 and the drift region 100 forms a pn-junction 103.

For example, the diode emitter region 102 may be arranged separately from the channel region 101. In another embodiment, wherein the power semiconductor device 1 may exhibit a stripe cell configuration, the diode emitter region 102 may be arranged within the same mesa and in contact with the channel region 101.

In an embodiment, the diode emitter region 102 exhibits a second common lateral extension range LX2 with the second back side emitter region 106. In other words, there is a finite lateral overlap LX2 along the first lateral direction X between the diode emitter region 102 arranged at the front side 10-1 and the second back side emitter region 106 arranged at the back side 10-2. For example, the second common lateral extension range LX2 amounts to at least 10%, at least 30%, at least 50%, or even 100% of a lateral extension of the diode emitter region 102 along the first lateral direction X. For example, in case there are a plurality of diode emitter regions 102 and/or a plurality of second back side emitter regions 106 provided in the semiconductor device 1 (not illustrated), the sum of the respective second common lateral extension ranges LX2 of each diode emitter region 102 with a second back side emitter region 106 may amount to at least 10%, at least 30%, or even at least 50% of the sum of the total lateral extensions of all diode emitter regions 102 along the first lateral direction X.

The diode emitter region 102 may be arranged and configured for injecting charge carriers of the second conductivity type into the drift region 100 during a reverse conducting operation of the power semiconductor device 1. For example, said injection of charge carriers of the second conductivity type may occur essentially independently of a switching state of the at least one transistor cell 130, i.e., independent of whether or not the control electrode 1310 induces a transport channel within the channel region 101.

Figure 1:
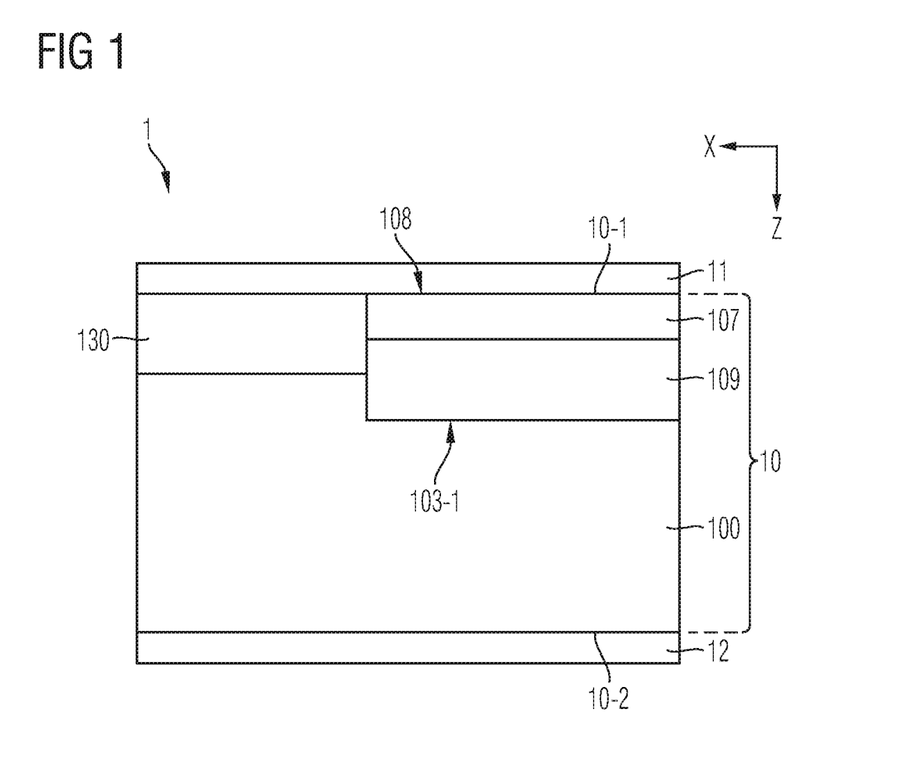
FIG. 1 schematically and exemplarily illustrates a section of a vertical cross-section of a power semiconductor device in accordance with one or more embodiments.
Figure 2:
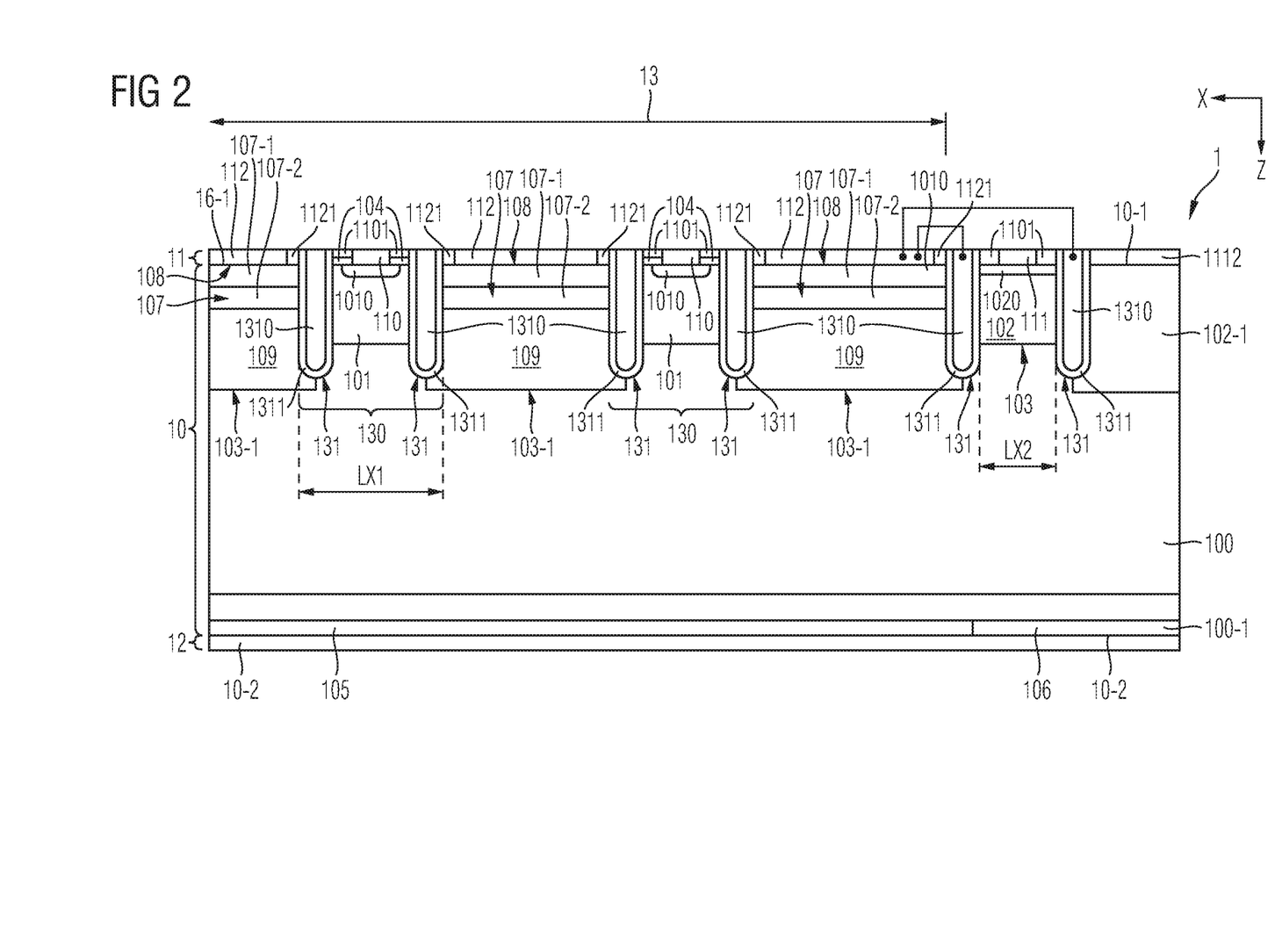
FIG. 2 schematically and exemplarily illustrates a section of a vertical cross-section of a power semiconductor device in accordance with one or more embodiments.

In an embodiment, as shown in FIGS. 2 to 5, at least a portion of the diode emitter region 102 is arranged laterally adjacent to and in contact with a trench 131. For example, as shown in the vertical cross-section in FIGS. 2 to 4, the diode emitter region 102 may be laterally confined by at least two trenches 131, similar to the channel regions 101 of the transistor cells 130. The one or more trenches 131 arranged adjacent to the diode emitter region 102 may comprise an electrode 1310. This electrode 1310 may be electrically connected with the gate terminal of the power semiconductor device 1 or with the first load terminal structure 11, as schematically illustrated in FIG. 2.

Figure 5:
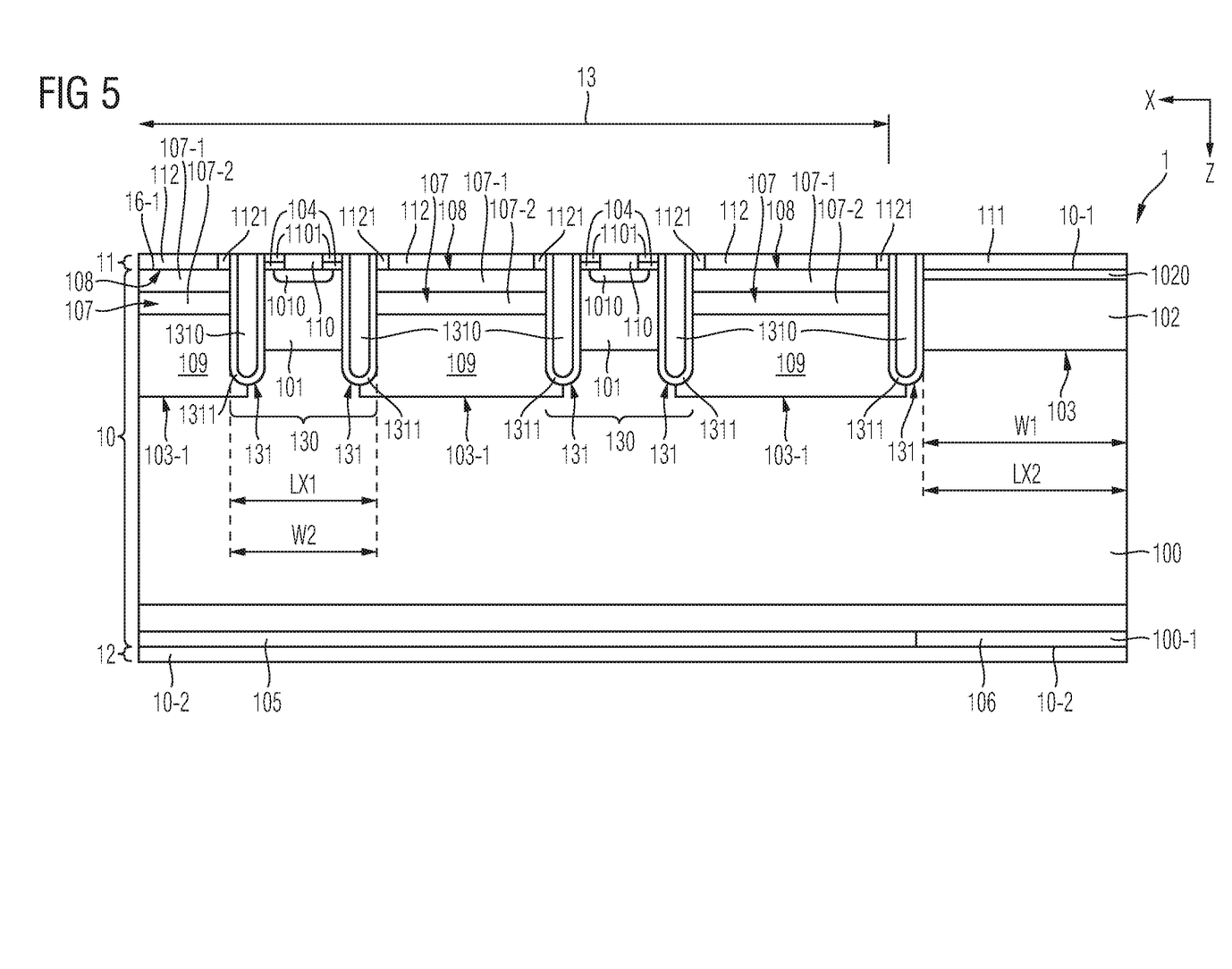
FIG. 5 schematically and exemplarily illustrates a section of a vertical cross-section of a power semiconductor device in accordance with one or more embodiments.

In an embodiment illustrated in FIG. 5, the diode emitter region 102 has a larger lateral extension than each of the transistor cells 130. For example, a lateral extension W1 of the diode emitter region 102 amounts to at least 3 times, such as at least 5 times, or even at least 10 times of a lateral extension W2 of the at least one transistor cell 130.

As depicted in FIGS. 2 and 3, in addition to the diode emitter region 102, a floating region 102-1 being of the second conductivity type may be provided within the semiconductor body 10. For example, the floating region 102-1 may be separated from the diode emitter region 102 by a trench 131. Further, the floating region 102-1 may be insulated from the first load terminal structure 11 by an insulation region 1112, such as an oxide layer.

Figure 4:
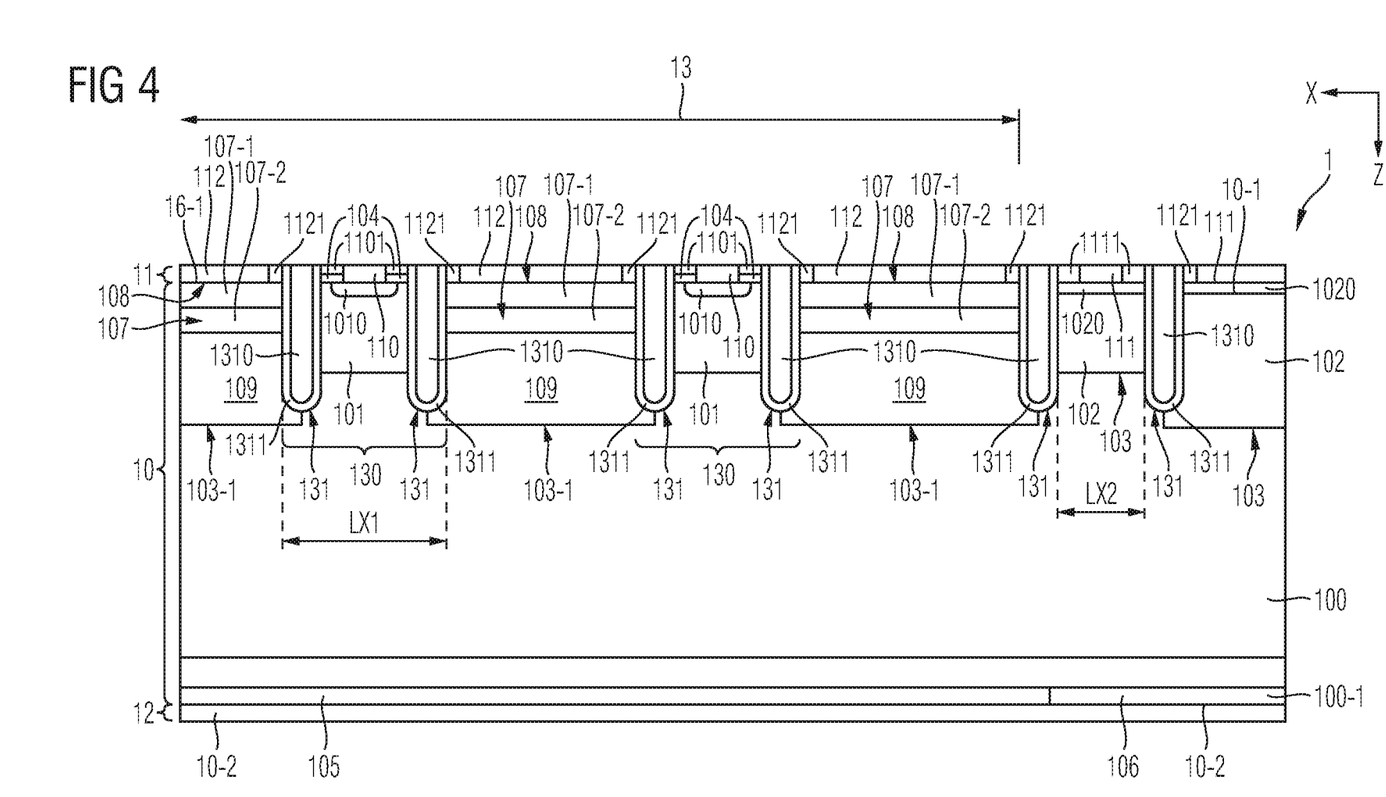
FIG. 4 schematically and exemplarily illustrates a section of a vertical cross-section of a power semiconductor device in accordance with one or more embodiments.

In the embodiment of FIG. 4, a further diode emitter region 102 is provided instead of the floating region 102-1, the further diode emitter region 102 being electrically connected with the first load terminal structure 11.

The diode emitter region 102 may comprise a second port region 1020 being arranged in contact with the first load terminal structure 11, wherein the concentration of dopants of the second conductivity type within the second port region 1020 is higher than the concentration of dopants of the second conductivity type within the remaining portion of the diode emitter region 102 at least by a factor of 10, such as at least by a factor of 100, or even at least by a factor of 1000. For example, the second port region 1020 is in contact with a third portion 111 of the first load terminal structure 11 (cf. FIGS. 2 to 5). For example, an ohmic contact is established at a transition between the second port region 1020 and the third portion 111 of the load terminal structure 11.

In accordance with an embodiment, the power semiconductor device 1 is a reverse conducting IGBT (RC-IGBT) having a transistor cell field 13 that comprises a plurality of transistor cells 130 and a plurality of transistor short regions 107 arranged within the transistor cell field 13 and external of the transistor cells 130 (cf. FIGS. 2 to 5). The first load terminal 11 may be an emitter terminal 11 of the RC-IGBT 1. The semiconductor body 10 of the reverse conducting IGBT 1 may further comprise a plurality of separation regions 109, each separation region 109 separating a transistor short region 107 from the drift region 100 of the reverse conducting IGBT 1, as described above. Further, one or more diode emitter regions 102 may be provided within the semiconductor body 10.

With reference to FIGS. 2 to 5, the semiconductor body 10 may further comprise a buffer layer 100-1 (commonly also referred to as field stop layer) being of the first conductivity type at a higher concentration than the drift region 100 and separating the drift region 100 from at least the first back side emitter region 105. For example, a maximum of the dopant concentration of the buffer region 100-1 exceeds a dopant concentration of the drift region 100 at least by a factor of 10, such as at least by a factor of 100, or even at least by a factor of 1000. Further, the buffer layer 100-1 may be arranged and configured for separating the drift region 100 also from the second back side emitter region 106.

In a variant, the semiconductor body 10 may comprise an intermediate region (not illustrated) being of the first conductivity type at higher dopant concentration than the drift region 100 and extending below at least one of the transistor cell 130, the diode emitter region 102, and the separation region 109, such that at least a portion of the drift region 100 extends below the intermediate region. For example, a dopant concentration of the intermediate region exceeds a dopant concentration of the drift region 100 at least by a factor of 10, such as at least by a factor of 100, or even at least by a factor of 1000.

Further, with reference to FIGS. 2 to 5, one or more insulation blocks 1101, 1111, 1121 may be provided at the front side 10-1 of the semiconductor body 10 adjacent to the trenches 131. For example, the insulation blocks 1101, 1111, 1121 may comprise a dielectric material such as an oxide, e.g., silicon oxide. The insulation blocks 1101, 1111, 1121 may also extend above the trenches 131 and cover the electrodes 1310.

In accordance with another embodiment, a method of processing a power semiconductor device 1 is presented. The method may comprise the following steps: providing a semiconductor body 10 having a front side 10-1 and a back side 10-2; providing, within the semiconductor body 10, a drift region 100 being of a first conductivity type; creating at least one transistor cell 130 at the front side 10-1, wherein the transistor cell is at least partially included in the semiconductor body 10 and is electrically connected to the drift region 100; creating within the semiconductor body 10: a transistor short region 107 being arranged at the front side 10-1 and being of the first conductivity type; and a separation region 109 separating the transistor short region 107 from the drift region 100 and being of a second conductivity type complementary to the first conductivity type; and creating a first load terminal structure 11 at the front side 10-1, such that the first load terminal structure 11 is electrically connected to the at least one transistor cell 130 and a Schottky contact 108 is formed at a transition between the transistor short region 107 and the first load terminal structure 11.

Exemplary ways of implementing the method presented above may correspond to the embodiments of the power semiconductor device 1 described above and as laid out in the dependent claims. In so far, it is referred to the aforesaid.

The embodiments described above include the recognition that in power semiconductor devices having a reverse conduction capability, such as RC-IGBTs, the performance in the reverse conducting mode may depend on a gate-emitter voltage that is provided to a gate electrode of a transistor cell. For example, an emitter efficiency of a body diode may be reduced if a transport channel is provided by the gate electrode, thereby reducing the charge carrier density and increasing conduction losses in the reverse conducting mode. It may thus be desirable to render the reverse conducting behavior of a power semiconductor device independent of the gate-emitter voltage that is currently provided to the gate electrode.

In accordance with one or more embodiments, a power semiconductor device, such as an RC-IGBT, has a plurality of transistor cells and one or more transistor short regions arranged external of the transistor cells. The at least one transistor short region has a net dopant concentration of a first conductivity type, which is the conductivity type that also prevails in a drift region of the device. A transition between the transistor short region and a first load terminal structure (such as an emitter terminal in the case of an RC-IGBT) forms a Schottky contact. The Schottky contact may be configured for reducing an emitter efficiency of a channel region (or body region) during the reverse conducting operation of the power semiconductor device by providing for a possibility for charge carriers to flow to the load terminal structure without causing an injection of charge carriers of the second conductivity type from the channel region into the drift region.

Further, a separation region being of the second conductivity type is provided, the separation region separating the transistor short region from the drift region. The separation region may be configured for building up a blocking pn-junction to the drift region, thereby ensuring a relatively high blocking capability of the power semiconductor device.

In accordance with one or more further embodiments, the power semiconductor device may comprise a diode emitter region being arranged external of the at least one transistor cell and being of the second conductivity type, wherein the diode emitter region is electrically connected to the first load terminal structure. The diode emitter region may be configured for injecting charge carriers of the second conductivity type into the drift region during the reverse conducting operation of the power semiconductor device. For example, said injection of charge carriers of the second conductivity type may occur essentially independently of a switching state of the at least one transistor cell, i.e., independent of whether or not the control electrode induces a transport channel within the channel region.

In the above, embodiments pertaining to semiconductor device processing methods were explained. For example, these semiconductor devices are based on silicon (Si). Accordingly, a monocrystalline semiconductor region or layer, e.g., the semiconductor body 10, the drift region 100, the source region 104, and the channel region 101 of exemplary embodiments, can be a monocrystalline Si-region or Si-layer. In other embodiments, polycrystalline or amorphous silicon may be employed.

It should, however, be understood that the semiconductor body 10 and components, e.g., regions 100, 100-1, 102, 104, 107, and 109 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)— aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device comprising a semiconductor body, a first load terminal structure arranged at a front side of the semiconductor body, and a second load terminal structure arranged at a back side of the semiconductor body, and being configured for controlling a load current between the first load terminal structure and the second load terminal structure by means of at least one transistor cell, the at least one transistor cell being at least partially included in the semiconductor body and being electrically connected to the first load terminal structure on one side and to a drift region of the semiconductor body on the other side, the drift region being of a first conductivity type, wherein the semiconductor body further comprises:
   a transistor short region of the first conductivity type arranged external of the at least one transistor cell, wherein a transition between the transistor short region and the first load terminal structure forms a Schottky contact outside the at least one transistor cell;
   a separation region separating the transistor short region from the drift region outside the at least one transistor cell, the separation region being of a second conductivity type complementary to the first conductivity type; and
   a diode emitter region of the second conductivity type arranged external of the at least one transistor cell and being electrically connected to the first load terminal structure, wherein a transition between the diode emitter region and the drift region forms a pn-junction,
   wherein the transistor short region is arranged laterally adjacent to and in contact with a trench of the at least one transistor cell,
   wherein the transistor short region is laterally confined by at least two trenches,
   wherein a lateral distance of the at least two trenches is smaller than a depth of at least one of the at least two trenches.

2. The power semiconductor device of claim 1, wherein the transistor short region comprises a first portion interfacing with the first load terminal structure and a second portion interfacing with the separation region, and wherein a concentration of dopants of the first conductivity type within the first portion is lower than a concentration of dopants of the first conductivity type within second portion at least by a factor of 10.

3. The power semiconductor device of claim 1, wherein, within the transistor short region, a concentration of dopants of the first conductivity type decreases at least by a factor of 10 along a direction heading from the separation region to the first load terminal structure.

4. The power semiconductor device of claim 1, wherein the power semiconductor device comprises at least two transistor cells, and wherein the transistor short region is arranged external of and laterally in between the at least two transistor cells.

5. The power semiconductor device of claim 1, wherein the semiconductor body comprises a first back side emitter region of the second conductivity type arranged in electrical contact with the second load terminal structure.

6. The power semiconductor device of claim 5, wherein the at least one transistor cell exhibits at least a common lateral extension range with the first back side emitter region.

7. The power semiconductor device of claim 1, wherein the semiconductor body comprises a second back side emitter region of the first conductivity type arranged in electrical contact with the second load terminal structure.

8. The power semiconductor device of claim 7, wherein the diode emitter region has at least a common lateral extension range with the second back side emitter region.

9. The power semiconductor device of claim 7, wherein a lateral extension of the diode emitter region is at least 3 times of a lateral extension of the at least one transistor cell.

10. The power semiconductor device of claim 7, wherein the diode emitter region comprises a second port region arranged in contact with the first load terminal structure, and wherein a concentration of dopants of the second conductivity type within the second port region is higher than a concentration of dopants of the second conductivity type within the remaining portion of the diode emitter region at least by a factor of 10.

11. The power semiconductor device of claim 1, wherein at least a portion of the separation region is arranged laterally adjacent to and in contact with the at least two trenches.

12. The power semiconductor device of claim 11, wherein the separation region extends within the semiconductor body at least as deep as half of a depth of the at least two trenches.

13. The power semiconductor device of claim 1, wherein at least a portion of the diode emitter region is arranged laterally adjacent to and in contact with a trench, and wherein the trench comprises an electrode.

14. The power semiconductor device of claim 13, wherein the electrode is electrically connected with the first load terminal structure.

15. The power semiconductor device of claim 1, wherein the semiconductor body further comprises a contact region of the second conductivity type arranged in contact with each of the first load terminal structure and the transistor short region.

16. The power semiconductor device of claim 1, wherein the power semiconductor device has a reverse current capability.

17. A reverse conducting IGBT comprising a semiconductor body and a plurality of transistor cells implemented at least partially in the semiconductor body, the reverse conducting IGBT further comprising, within the semiconductor body and external of the plurality of transistor cells:

a transistor short region of a first conductivity type interfacing with an emitter terminal of the reverse conducting IGBT, wherein a transition between the transistor short region and the emitter terminal forms a Schottky contact outside the plurality of transistor cells; and a separation region separating the transistor short region from a drift region of the reverse conducting IGBT outside the plurality of transistor cells, the separation region being of a second conductivity type complementary to the first conductivity type, and the drift region being of the first conductivity type, wherein the transistor short region is arranged laterally adjacent to and in contact with a trench of the plurality of transistor cells, wherein the transistor short region is laterally confined by at least two trenches, wherein a lateral distance of the at least two trenches is smaller than a depth of at least one of the at least two trenches.

18. A method of processing a power semiconductor device, the method comprising:

providing a semiconductor body having a front side and a back side;

providing, within the semiconductor body, a drift region of a first conductivity type;

forming at least one transistor cell at the front side, wherein the at least one transistor cell being at least partially included in the semiconductor body and electrically connected to the drift region;

forming within the semiconductor body:

a transistor short region of the first conductivity type arranged at the front side and external of the at least one transistor cell; and a separation region separating the transistor short region from the drift region outside the at least one transistor cell, the separation region being of a second conductivity type complementary to the first conductivity type; and forming a first load terminal structure at the front side, such that the first load terminal structure is electrically connected to the at least one transistor cell and a Schottky contact is formed outside the at least one transistor cell at a transition between the transistor short region and the first load terminal structure, wherein the transistor short region is arranged laterally adjacent to and in contact with a trench of the at least one transistor cell, wherein the transistor short region is laterally confined by at least two trenches, wherein a lateral distance of the at least two trenches is smaller than a depth of at least one of the at least two trenches.

* * * * *

UNITED STATES PATENT AND TRADEMARK OFFICE
CERTIFICATE OF CORRECTION

PATENT NO.       : 10,930,770 B2
APPLICATION NO.  : 15/998630
DATED            : February 23, 2021
INVENTOR(S)      : H. Eckel et al.

It is certified that error appears in the above-identified patent and that said Letters Patent is hereby corrected as shown below:

In the Claims

Column 14, Line 2 Claim 2, change "within second" to -- within a second --

Signed and Sealed this
Twenty-ninth Day of June, 2021

Drew Hirshfeld
*Performing the Functions and Duties of the
Under Secretary of Commerce for Intellectual Property and
Director of the United States Patent and Trademark Office*